United States Patent
Chu

(10) Patent No.: US 12,176,051 B2
(45) Date of Patent: Dec. 24, 2024

(54) TEST METHOD FOR TESTING DECISION FEEDBACK EQUALIZATION OF MEMORY DEVICE

(71) Applicant: NANYA TECHNOLOGY CORPORATION, New Taipei (TW)

(72) Inventor: Yi-Hsuan Chu, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 133 days.

(21) Appl. No.: 18/193,645

(22) Filed: Mar. 31, 2023

(65) Prior Publication Data

US 2024/0331791 A1   Oct. 3, 2024

(51) Int. Cl.
G11C 29/00 (2006.01)
G11C 29/12 (2006.01)
G11C 29/36 (2006.01)
G11C 29/46 (2006.01)

(52) U.S. Cl.
CPC ........ G11C 29/36 (2013.01); G11C 29/12015 (2013.01); G11C 29/46 (2013.01)

(58) Field of Classification Search
CPC .... G11C 29/36; G11C 29/12015; G11C 29/46
See application file for complete search history.

(56) References Cited

U.S. PATENT DOCUMENTS

| | | | |
|---|---|---|---|
| 10,417,171 B1 * | 9/2019 | Sarmah | G06F 1/3253 |
| 2011/0161752 A1 | 6/2011 | Spry et al. | |
| 2016/0041938 A1 * | 2/2016 | Ishii | G06F 13/4282 710/313 |
| 2016/0149656 A1 | 5/2016 | Levin et al. | |
| 2017/0213585 A1 | 7/2017 | Schoenborn et al. | |
| 2020/0334121 A1 | 10/2020 | Morris | |

FOREIGN PATENT DOCUMENTS

TW    466474    12/2001

OTHER PUBLICATIONS

"Notice of allowance of Taiwan Counterpart Application", issued on Jul. 18, 2024, p. 1-p. 3.

* cited by examiner

Primary Examiner — Han Yang
(74) Attorney, Agent, or Firm — JCIPRNET

(57) ABSTRACT

A test method is for testing a decision feedback equalization (DFE) of a memory device is provided. The memory device includes a memory bank. The test method includes: providing a first test data pattern having a first data transition frequency and a second test data pattern having a second data transition frequency different from the first data transition frequency; writing the first test data pattern into a first memory section of the memory bank with a first DFE; writing the second test data pattern into a second memory section of the memory bank with the first DFE; reading a first reading data pattern stored in the first memory section and a second reading data pattern stored in the second memory section; and generating a test result signal according to the first reading data pattern and the second reading data pattern.

10 Claims, 8 Drawing Sheets

TEST METHOD FOR TESTING DECISION FEEDBACK EQUALIZATION OF MEMORY DEVICE

BACKGROUND

Technical Field

The disclosure generally relates to a test method, and more particularly to a test method for a decision feedback equalization (DFE) of a memory device.

Description of Related Art

Generally, in order to compensate an influence of inter symbol interference (ISI), a memory device performs a writing operation with a decision feedback equalization (DFE).

However, an original setting of the DFE may not be suitable for the memory device. Thus, how to provide a test method for the DFE of the memory device is one of the research and development focuses of those skilled in the art.

SUMMARY

The disclosure provides a test method for testing a decision feedback equalization (DFE) of a memory device.

The test method is used to test the DFE of the memory device. The memory device includes a memory bank and a memory controller. The test method includes: providing, by the memory controller, a first test data pattern having a first data transition frequency and a second test data pattern having a second data transition frequency different from the first data transition frequency; writing, by the memory controller, the first test data pattern into a first memory section of the memory bank with a first DFE in a first write interval; writing, by the memory controller, the second test data pattern into a second memory section of the memory bank with the first DFE in a second write interval; reading, by the memory controller, a first reading data pattern stored in the first memory section and a second reading data pattern stored in the second memory section in a first read interval after the first write interval and the second write interval; and generating, by the memory controller, at least one test result signal of the first DFE according to the first reading data pattern and the second reading data pattern.

Based on the above, the memory controller generates the test result signal of the first DFE according to the first reading data pattern and the second reading data pattern. Therefore, the test result signal of the first DFE indicates whether the first DFE is suitable for the first data transition frequency or the second data transition frequency.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

A disclosure may be understood by reference to the following detailed description, taken in conjunction with the drawings as described below. It is noted that, for purposes of illustrative clarity and being easily understood by the readers, various drawings of this disclosure show a portion of an electronic device, and certain elements in various drawings may not be drawn to scale. In addition, the number and dimension of each device shown in drawings are only illustrative and are not intended to limit the scope of a disclosure.

Certain terms are used throughout the description and following claims to refer to particular components. As one skilled in the art will understand, electronic equipment manufacturers may refer to a component by different names. This document does not intend to distinguish between components that differ in name but not function. In the following description and in the claims, the terms "include", "comprise" and "have" are used in an open-ended fashion, and thus should be interpreted to mean "include, but not limited to . . . ". Thus, when the terms "include", "comprise" and/or "have" are used in the description of a disclosure, the corresponding features, areas, steps, operations and/or components would be pointed to existence, but not limited to the existence of one or a plurality of the corresponding features, areas, steps, operations and/or components.

It will be understood that when an element is referred to as being "coupled to", "connected to", or "conducted to" another element, it may be directly connected to the other element and established directly electrical connection, or intervening elements may be presented therebetween for relaying electrical connection (indirectly electrical connection). In contrast, when an element is referred to as being "directly coupled to", "directly conducted to", or "directly connected to" another element, there are no intervening elements presented.

Figure 1:
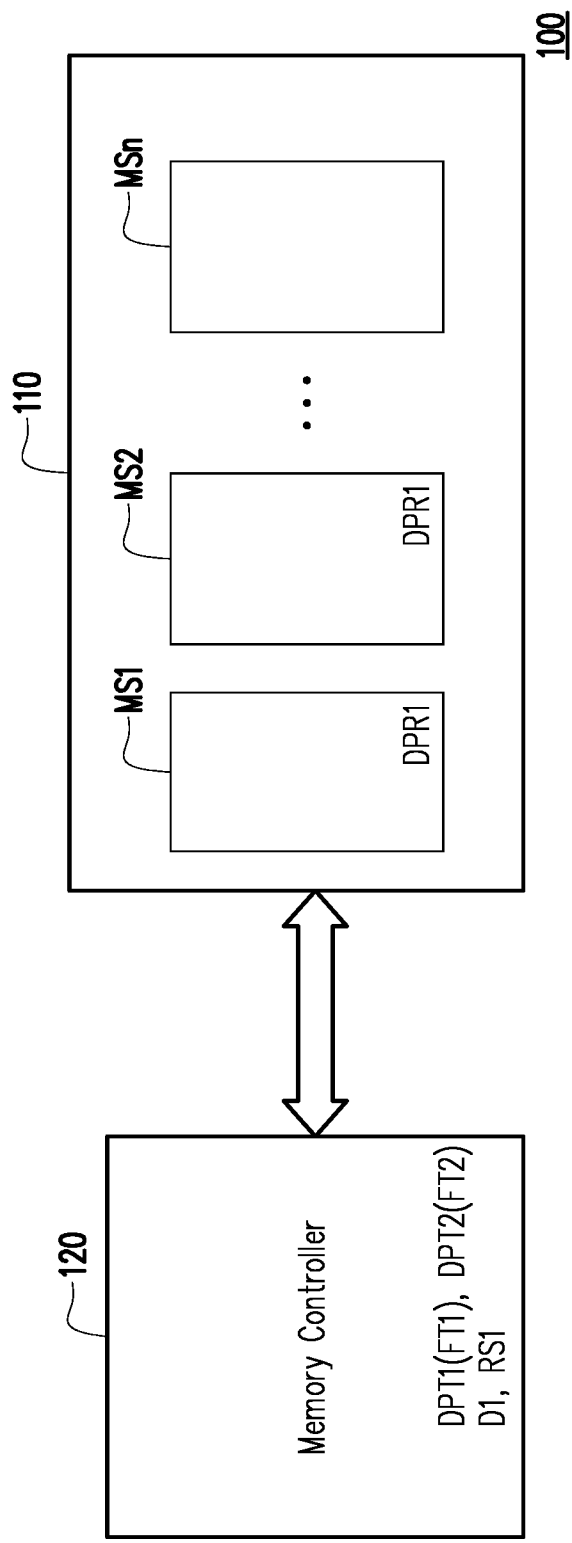
FIG. 1 illustrates a schematic diagram of a memory device according to a first embodiment of the disclosure.
Figure 2:
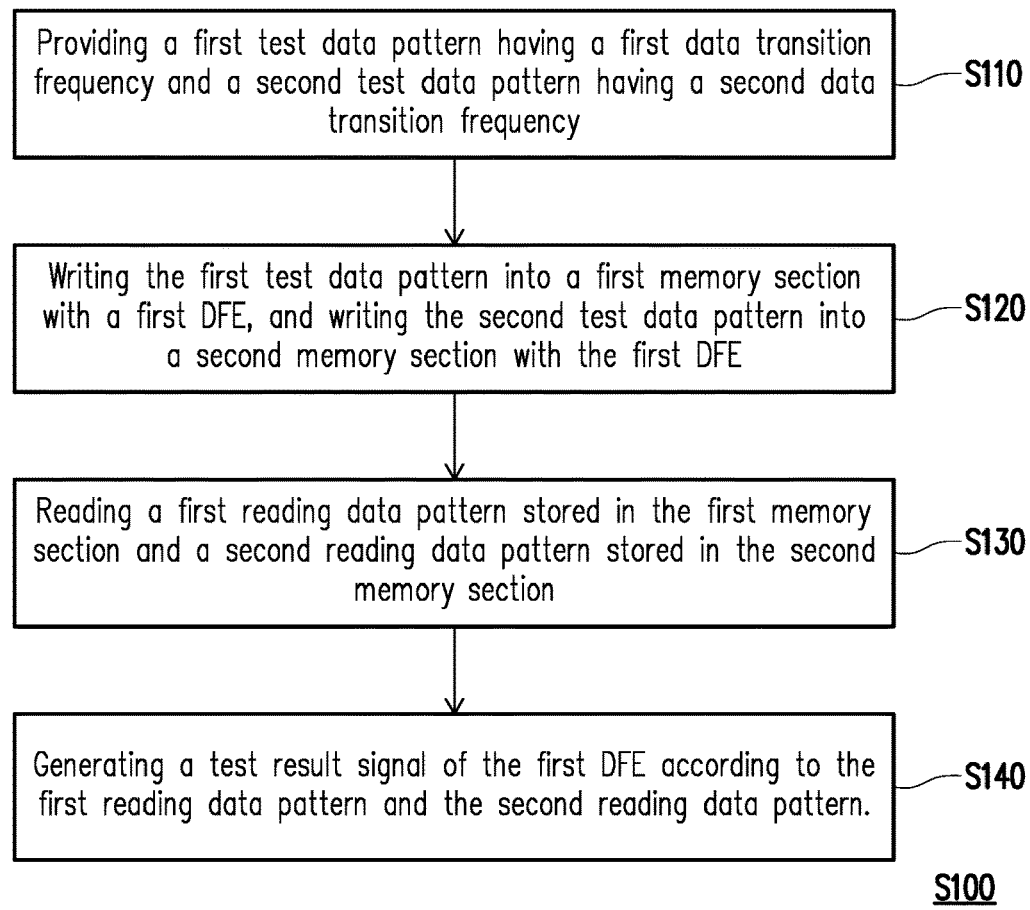
FIG. 2 illustrates a flowchart of a test method according to a first embodiment of the disclosure.

FIG. 1 illustrates a schematic diagram of a memory device according to a first embodiment of the disclosure. FIG. 2 illustrates a flowchart according to a first embodiment of the disclosure. Please refer to FIG. 1 and FIG. 2. In the embodiment, a memory device 100 includes a memory bank 110 and a memory controller 120. The memory controller 120 is connected to the memory bank 110. The memory controller 120 performs operations on the memory bank 110. For example, the operations include a writing operation, a reading operation, a refreshing operation and an erasing operation. The memory bank 110 includes memory sections MS1 to MSn. For example, each of the memory sections MS1 to MSn is one memory page, one memory block or a portion of one memory page. In the embodiment, each of the memory sections MS1 to MSn includes any type of memory cells.

In the embodiment, the memory controller 120 performs the writing operation on the memory bank 110 with a decision feedback equalization (DFE). Therefore, an influence of inter symbol interference (ISI) in the memory device 100 when performing the writing operation could be compensated.

The test method S100 is used to test whether the DFE is suitable for the writing operation. The test method S100 includes steps S110 to S140. In the step S110, the memory controller 120 provides test data patterns DPT1 and DPT2. The test data pattern DPT1 includes a data transition frequency FT1. The test data pattern DPT2 includes a data transition frequency FT2. The data transition frequency FT1 is different from the data transition frequency FT2.

In the step S120, the memory controller 120 writes the test data pattern DPT1 into the memory section MS1 with a first DFE D1 in a first write interval. In the step S120, the memory controller 120 further writes the test data pattern DPT2 into the memory section MS2 with the first DFE D1 in a second write interval.

In the step S130, in a first read interval after the first write interval and the second write interval, the memory controller 120 reads a reading data pattern DPR1 stored in the memory section MS1 and a reading data pattern DPR1 stored in the memory section MS2. In other words, after the step S120, the memory controller 120 reads the reading data pattern DPR1 corresponding to the test data pattern DPT1 from the memory section MS1 and reads the reading data pattern DPR2 corresponding to the test data pattern DPT2 from the memory section MS2 in the step S130.

In the step S140, the memory controller 120 generates a test result signal RS1 of the first DFE D1 according to the reading data patterns DPR1 and DPR2.

It should be noted, the memory controller 120 writes the test data pattern DPT1 into the memory section MS1 with a first DFE D1 and writes the test data pattern DPT2 into the memory section MS2 with the first DFE D1 in the step S120. In the step S130, the memory controller 120 reads the reading data pattern DPR1 from the memory section MS1 and reads the reading data pattern DPR2 from the memory section MS2. Therefore, the test result signal generated in the step S140 may indicate whether the first DFE is suitable for the data transition frequency FT1 or the data transition frequency FT2.

For example, the memory controller 120 compares the test data pattern DPT1 and the reading data pattern DPR1. When the test data pattern DPT1 is different from the reading data pattern DPR1, the memory controller 120 generates the test result signal RS1 of the first DFE D1. The test result signal RS1 indicates that the test data pattern DPT1 is different from the reading data pattern DPR1. Thus, based on the above test result signal RS1, users can judge that the writing operation with the first DFE D1 is not suitable for the data transition frequency FT1.

On the other hand, when the test data pattern DPT1 is equal to the reading data pattern DPR1, the memory controller 120 generates the test result signal RS1 of the first DFE D1. The test result signal RS1 indicates that the test data pattern DPT1 is equal to the reading data pattern DPR1. Thus, based on the above test result signal RS1, the users can judge that the writing operation with the first DFE D1 is suitable for the data transition frequency FT1.

For example, the memory controller 120 compares the test data pattern DPT2 and the reading data pattern DPR2. When the test data pattern DPT2 is different from the reading data pattern DPR2, the memory controller 120 generates the test result signal RS1 of the first DFE D1. The test result signal RS1 indicates that the test data pattern DPT2 is different from the reading data pattern DPR2. Thus, based on above the test result signal RS1, the users can judge that the writing operation with the first DFE D1 is not suitable for the data transition frequency FT2.

On the other hand, when the test data pattern DPT2 is equal to the reading data pattern DPR2, the memory controller 120 generates the test result signal RS1 of the first DFE D1. The test result signal RS1 indicates that the test data pattern DPT2 is equal to the reading data pattern DPR2. Thus, based on the above test result signal RS1, the users can judge that the writing operation with the first DFE D1 is suitable for the data transition frequency FT2.

In the embodiment, the data transition frequency FT1 is higher than the data transition frequency FT2. The data transition frequency FT1 is called a high data transition frequency. The data transition frequency FT2 is called a low data transition frequency. For example, the test data pattern DPT1 includes at least one of binary data "01010101" and "10101010". Therefore, the data transition frequency FT1 is equal to a frequency a clock of the memory device 100.

For example, the test data pattern DPT2 includes at least one of binary data "00110011", "11001100", "00010001", "11101110", "00001111" and "11110000".

Figure 3:
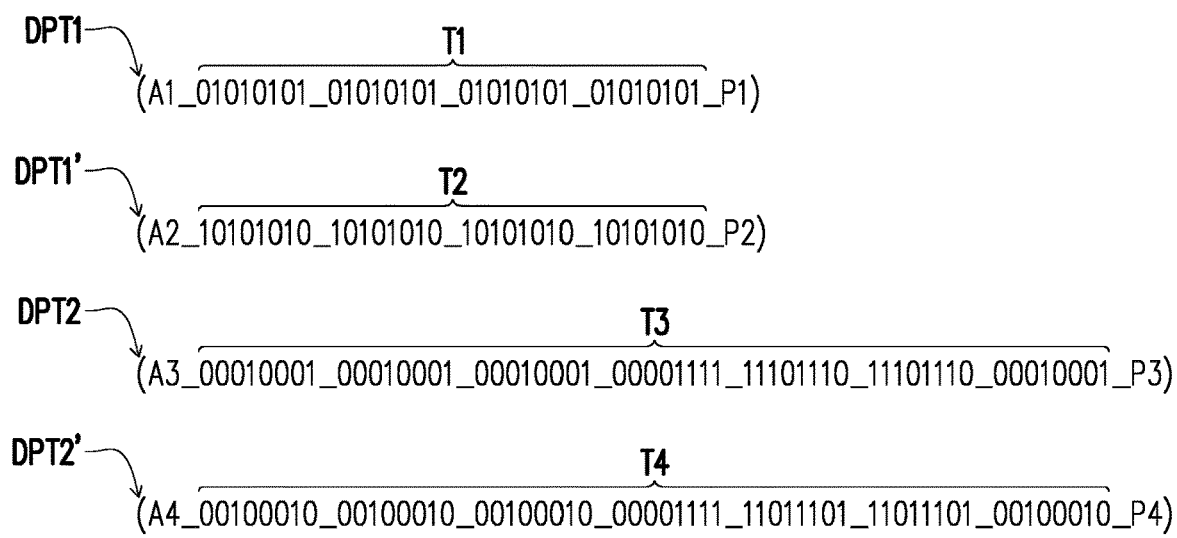
FIG. 3 illustrates test data patterns according to an embodiment of the disclosure.

FIG. 3 illustrates test data patterns according to an embodiment of the disclosure. Please refer to FIG. 1 and FIG. 3, FIG. 3 illustrates the test data pattern DPT1 and DPT2 and a test data pattern DPT1' and DPT2'. In the embodiment, the test data pattern DPT1 includes a head data A1, a tail data P1 and a test data T1. The test data T1 includes four binary data "01010101". The disclosure is not limited by a number of the binary data. In order to clearly distinguish the head data A1, a tail data P1 and the binary data of the test data T1, the head data A1, a tail data P1 and the binary data are separated by a symbol "_".

The head data A1 is an active signal. When writing the test data pattern DPT1, the memory controller 120 actives in a test mode in the first write interval and performs writes the test data pattern DPT1 into the memory section MS1 with the first DFE D1 according to the head data A1. The tail data P1 may be a pre-charge signal. The memory controller 120 finishes writing the test data pattern DPT1 according to the tail data P1. Therefore, the memory controller 120 leaves the test mode. The first write interval is finished.

In the embodiment, the test data pattern DPT1' includes a head data A2, a tail data P2 and a test data T2. The test data T2 includes four binary data "10101010". The test data T1 and T2 are complement each other.

The head data A2 is the active signal. When writing the test data pattern DPT1', the memory controller 120 actives in the test mode in the first write interval and performs writes the test data pattern DPT1' into the memory section MS1 with the first DFE D1 according to the head data A2. The tail data P2 may be the pre-charge signal. The memory controller 120 finishes writing the test data pattern DPT1' according to the tail data P2. Therefore, the memory controller 120 leaves the test mode. The first write interval is finished.

In the embodiment, the test data pattern DPT2 includes a head data A3, a tail data P3 and a test data T3. The test data T3 includes at least one of binary data "00110011", "11001100", "00010001", "11101110", "00001111" and "11110000". The disclosure is not limited by an arrangement and a combination of the at least one of binary data of the test data T3 in the embodiment.

The head data A3 is the active signal. When writing the test data pattern DPT2, the memory controller 120 actives in the test mode in the second write interval and performs writes the test data pattern DPT2 into the memory section MS2 with the first DFE D1 according to the head data A3. The tail data P3 may be the pre-charge signal. The memory controller 120 finishes writing the test data pattern DPT2 according to the tail data P3. Therefore, the memory controller 120 leaves the test mode. The second write interval is finished.

In the embodiment, the test data pattern DPT2' includes a head data A4, a tail data P4 and a test data T4. The test data T4 also includes at least one of binary data "00110011", "11001100", "00010001", "11101110", "00001111" and "11110000". The disclosure is not limited by an arrangement and a combination of the at least one of binary data of the test data T4 in the embodiment. The test data T3 and T4 are different from each other.

The head data A4 is the active signal. When writing the test data pattern DPT2', the memory controller 120 actives in the test mode in the second write interval and performs writes the test data pattern DPT2' into the memory section MS2 with the first DFE D1 according to the head data A4. The tail data P4 may be the pre-charge signal. The memory controller 120 finishes writing the test data pattern DPT2' according to the tail data P4. Therefore, the memory controller 120 leaves the test mode. The second write interval is finished.

In some embodiment, the head data A1 to A4 and the tail data P1 to P4 may be skipped.

Figure 4A:
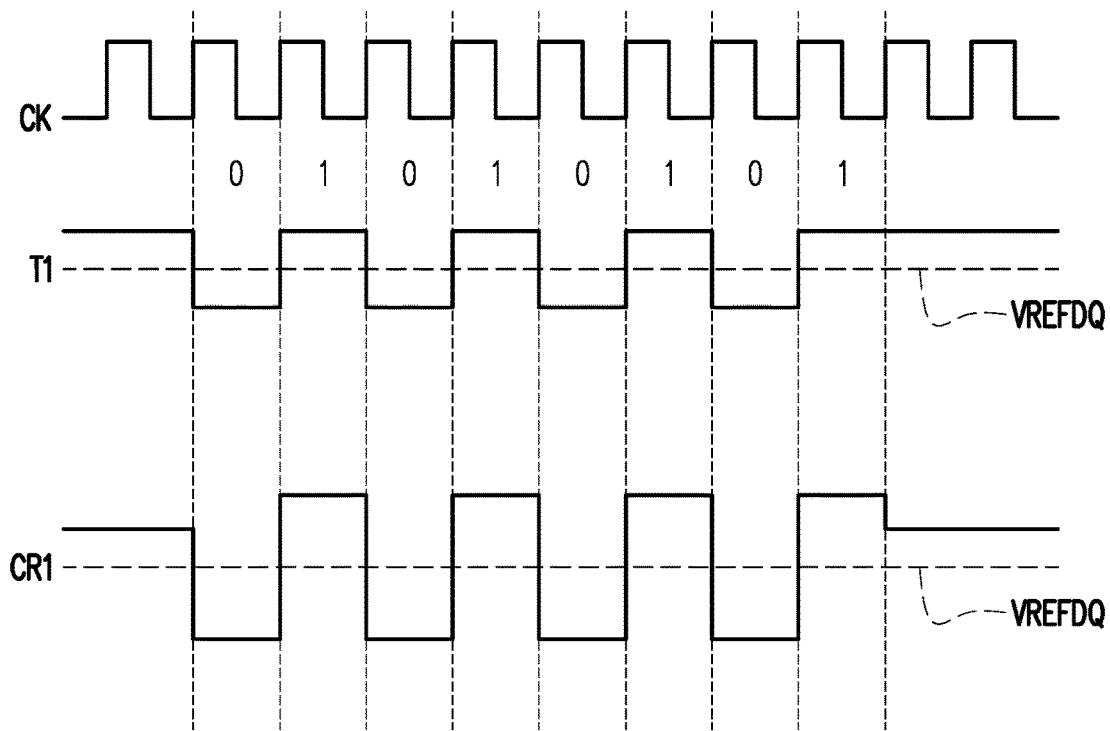
FIG. 4A illustrates timing diagrams according to an embodiment of the disclosure.

FIG. 4A illustrates timing diagrams according to a third embodiment of the disclosure. Please refer to FIG. 1 and FIG. 4A. FIG. 4A illustrates a timing diagrams of a clock CK of the memory device 100, a test data T1 of the test data pattern DPT1 and a compensation result CR1 of the test data pattern DPT1 based on the first DFE D1. The data transition frequency FT1 is equal to a frequency of the clock CK. The test data pattern DPT1 is a high frequency pattern. Based on a compensation rule of the first DFE D1, when a current data bit of the test data T1 is different from a previous data bit of the test data T1, a writing voltage of the current data bit would be enhanced based on a compensating voltage of the first DFE D1. When the current data bit is equal the previous data bit, the writing voltage of the current data bit would be weakened based on the compensating voltage of the first DFE D1.

The compensating voltage of the first DFE D1 is different from compensating voltages of other DFEs. Therefore, each of the DFEs has different compensating intensity.

In the embodiment, the test data T1 includes a binary data "01010101". Adjacent data bits are different from each other. Therefore, all of writing voltages of data bits of the test data T1 are enhanced.

Figure 4B:
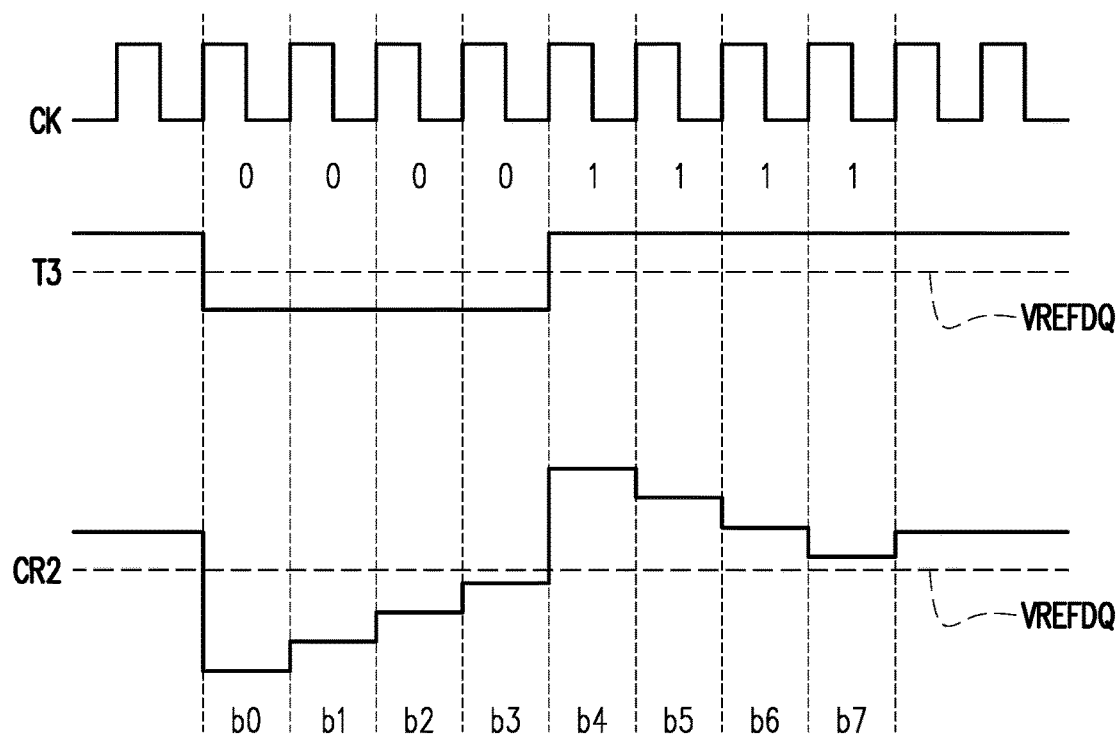
FIG. 4B illustrates timing diagrams according to an embodiment of the disclosure.

FIG. 4B illustrates timing diagrams according to an embodiment of the disclosure. FIG. 4B illustrates a timing diagrams of the clock CK, a test data T3 of the test data pattern DPT2 and a compensation result CR2 of the test data pattern DPT2 based on the first DFE D1. The data transition frequency FT2 is lower than the frequency of the clock CK. In the embodiment, the test data T3 includes a binary data "00001111".

Writing voltages of data bits b0 and b4 of the binary data are enhanced. Writing voltages of data bits b1 to b3 and b5 to b7 of the binary data are weakened. It should be noted, the writing voltages of data bits b3 and b7 are very weak. Therefore, the data bits b3 and b7 may be failure bits.

Figure 5:
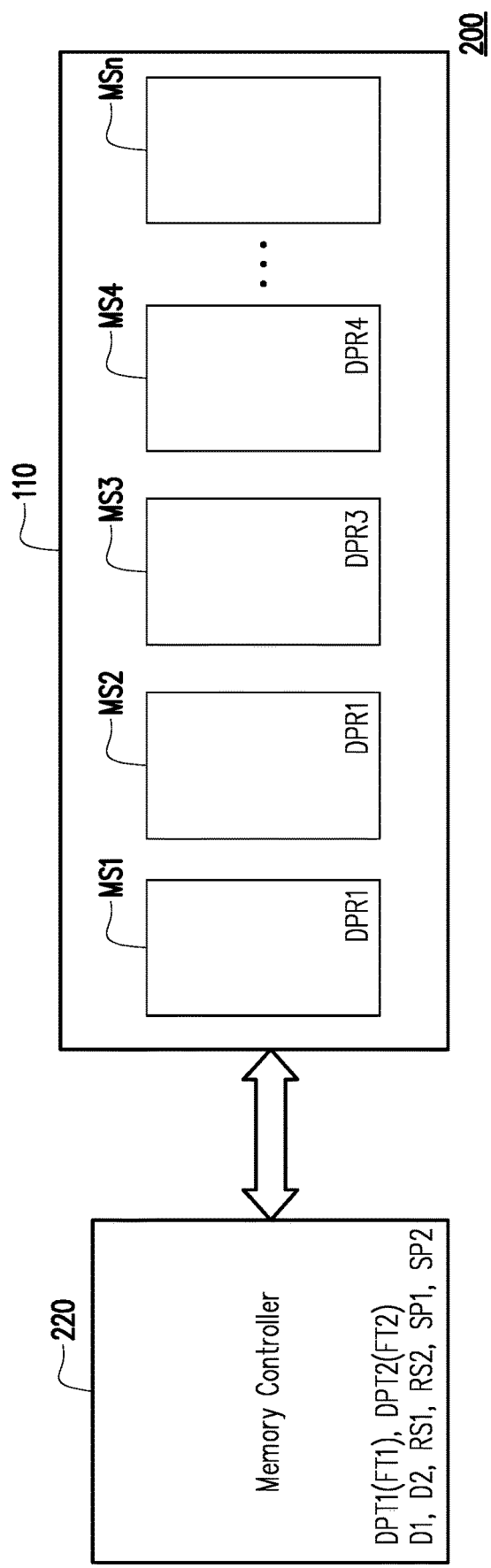
FIG. 5 illustrates a schematic diagram of a memory device according to a second embodiment of the disclosure.
Figure 6:
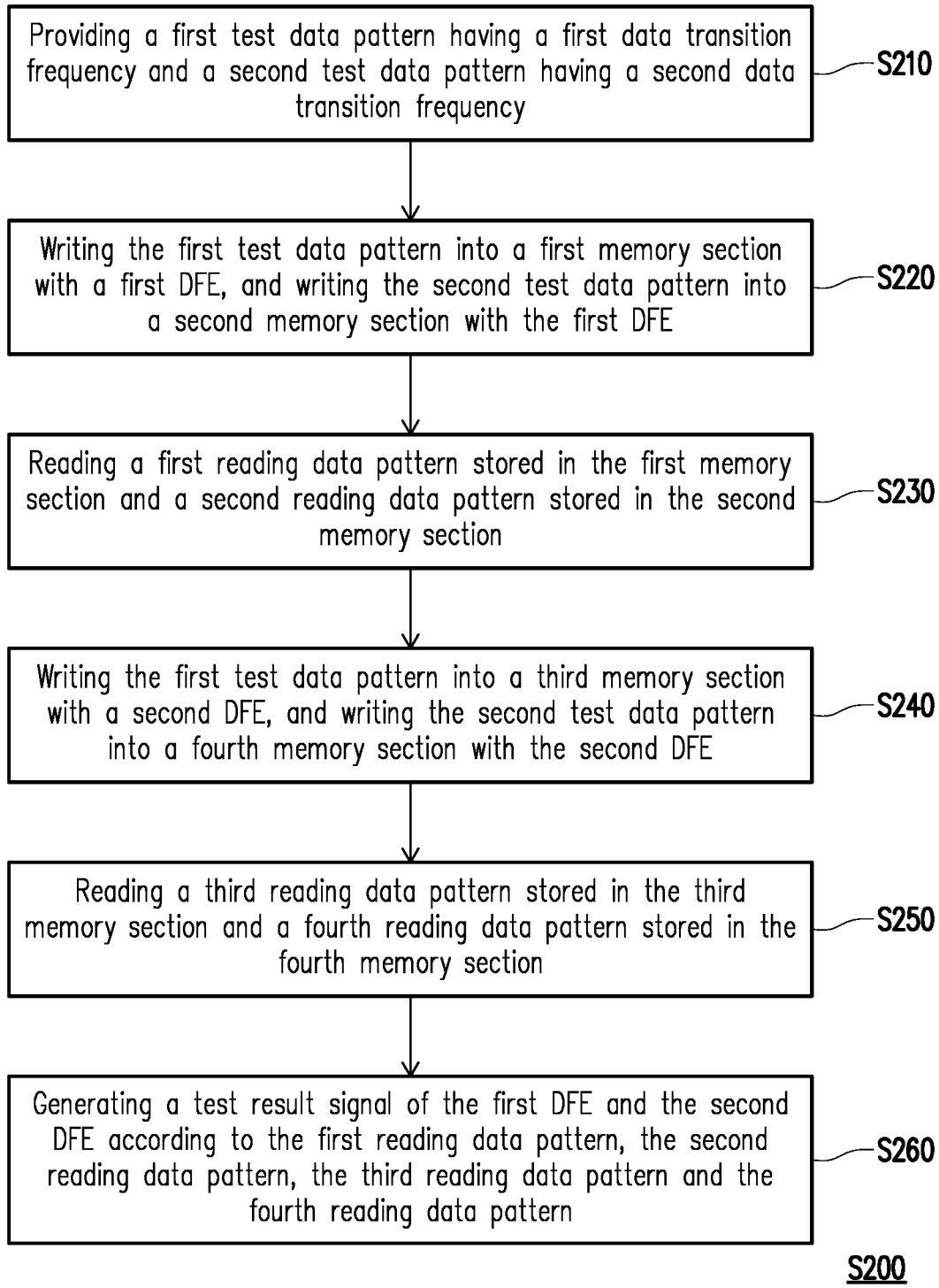
FIG. 6 illustrates a flowchart of a test method according to a second embodiment of the disclosure.

FIG. 5 illustrates a schematic diagram of a memory device according to an embodiment of the disclosure. FIG. 6 illustrates a flowchart according to a second embodiment of the disclosure. Please refer to FIG. 5 and FIG. 6. In the embodiment, a memory device 200 includes a memory bank 110 and a memory controller 220.

The test method S200 is used to test whether at least two DFEs is suitable for the writing operation. The test method S200 includes steps S210 to S260. In the step S210, the memory controller 220 provides the test data patterns DPT1 and DPT2. The test data pattern DPT1 includes a data transition frequency FT1. The test data pattern DPT2 includes a data transition frequency FT2. The data transition frequency FT1 is different from the data transition frequency FT2. An implementation of the test data patterns DPT1 and DPT2 may be sufficiently taught in the embodiment in FIG. 1 and FIG. 3, and is not repeated herein.

In the step S220, the memory controller 220 writes the test data pattern DPT1 into the memory section MS1 with the first DFE D1 in the first write interval. In the step S220, the memory controller 220 further writes the test data pattern DPT2 into the memory section MS2 with the first DFE D1 in the second write interval. In the step S230, in the first read interval after the first write interval and the second write interval, the memory controller 220 reads the reading data pattern DPR1 stored in the memory section MS1 and the reading data pattern DPR2 stored in the memory section MS2.

In the step S240, the memory controller 220 writes the test data pattern DPT1 into the memory section MS3 with a second DFE D2 in the third write interval. A compensating intensity of the first DFE D1 is different from a compensating intensity of the second DFE D2. In the step S240, the memory controller 220 further writes the test data pattern DPT2 into the memory section MS4 with the second DFE D2 in the fourth write interval. In the step S250, in the second read interval after the third write interval and the fourth write interval, the memory controller 220 reads a reading data pattern DPR3 stored in the memory section MS3 and a reading data pattern DPR4 stored in the memory section MS4.

In the step S260, the memory controller 220 generates the test result signal RS1 of the first DFE D1 and a test result signal RS2 of the second DFE D2 according to the reading data patterns DPR1 to DPR4.

The memory controller 220 generates the test result signal RS1 of the first DFE D1 according to the reading data patterns DPR1 and DPR2. The generating of the test result signal RS1 may be sufficiently taught in the embodiment in FIG. 1, and is not repeated herein.

In the step S260, the memory controller 220 generates the test result signal RS2 of the second DFE D1 according to the reading data patterns DPR3 and DPR4.

For example, the memory controller 220 compares the test data pattern DPT1 and the reading data pattern DPR3. When the test data pattern DPT1 is different from the reading data pattern DPR3, the memory controller 220 generates the test result signal RS2 of the second DFE D2. The test result signal RS2 indicates that the test data pattern DPT1 is different from the reading data pattern DPR3. Thus, based on the above test result signal RS2, the users can judge that the writing operation with the second DFE D2 is not suitable for the data transition frequency FT1.

On the other hand, when the test data pattern DPT1 is equal to the reading data pattern DPR3, the memory controller 220 generates the test result signal RS1 of the second DFE D2. The test result signal RS2 indicates that the test data pattern DPT1 is equal to the reading data pattern DPR3. Thus, based on the above test result signal RS2, the users can judge that the writing operation with the second DFE D2 is suitable for the data transition frequency FT1.

For example, the memory controller 220 compares the test data pattern DPT2 and the reading data pattern DPR4. When the test data pattern DPT2 is different from the reading data pattern DPR4, the memory controller 120 generates the test result signal RS2 of the second DFE D2. The test result signal RS2 indicates that the test data pattern DPT2 is different from the reading data pattern DPR4. Thus, based on above the test result signal RS2, the users can judge that the writing operation with the second DFE D2 is not suitable for the data transition frequency FT2.

On the other hand, when the test data pattern DPT2 is equal to the reading data pattern DPR4, the memory controller 120 generates the test result signal RS2 of the second DFE D2. The test result signal RS2 indicates that the test data pattern DPT2 is equal to the reading data pattern DPR4. Thus, based on the above test result signal RS2, the users can judge that the writing operation with the second DFE D2 is suitable for the data transition frequency FT2.

In some embodiments, the step S230 can be executed between steps S240 and S260.

In some embodiments, before the step S220, the memory controller 220 may initialize the memory sections MS1 to MS4. For example, the memory controller 220 may performs the erasing operation on the memory sections MS1 to MS4.

Figure 7:
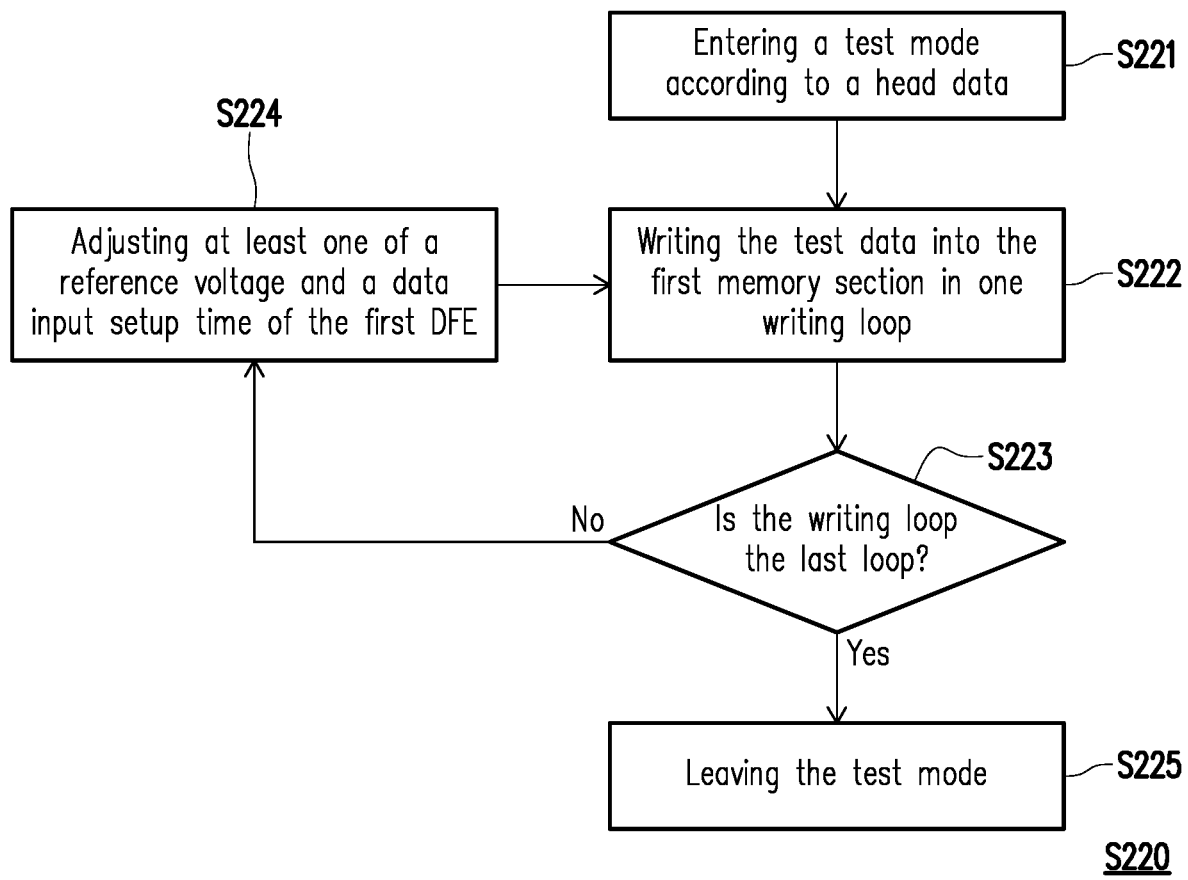
FIG. 7 illustrates a flowchart of the step S220 according to an embodiment of the disclosure.

FIG. 7 illustrates a flowchart of the step S220 according to an embodiment of the disclosure Please refer to FIG. 3, FIG. 5 and FIG. 7, in the step S220, the memory controller 220 writes the test data pattern DPT1 into the memory section MS1 with the first DFE D1 in a plurality of writing loops. In the embodiment, the step S220 includes steps S221 to S225. In the step S221, the memory controller 220 entering the test mode according to a head data A1. In the step S222, the memory controller 220 writes the test data T1 of the test data pattern DPT1 into the memory section MS1 in one writing loop. In the embodiment, at least one parameter of the first DFE D1 is adjusted per one writing loop. The memory section MS1 includes sub-sections. For example, in a first writing loop, the memory controller 220 writes the test data T1 into a first sub-section. In a second writing loop, the memory controller 220 writes the test data T1 into a second sub-section, and so on.

A number of the writing loops is decided before entering the test mode. Therefore, the memory controller 220 obtains the number of the writing loops and the last loop among the writing loops.

In the step S223, the memory controller 220 determines the current writing loop. When the current writing loop is not the last loop, the memory controller 220 adjusts at least one of a reference voltage VREFDQ and a data input setup time tDS of the first DFE D1 in the step S240. Then the memory controller 220 writes the test data T1 into a next sub-section of the memory section MS1 in next writing loop in the step S222 with the first DFE D1 after adjusted.

In the step S223, when the current writing loop is the last loop, the memory controller 220 leaves the test mode according the tail data P1 in the step S225.

The memory controller 220 may perform the step S240 by similar manner of the steps S221 to S225.

Besides, the memory controller 220 receives the reading data patterns DPR1 corresponding to every writing loop. Each of the reading data patterns DPR1 corresponds the first DFE D1 having a different reference voltage VREFDQ and a different data input setup time tDS. Therefore, the memory controller 220 creates a shmoo plot SP1 of the first DFE D1.

Similarly, the memory controller 220 further creates a shmoo plot SP2 of the second DFE D2.

Figure 8A:
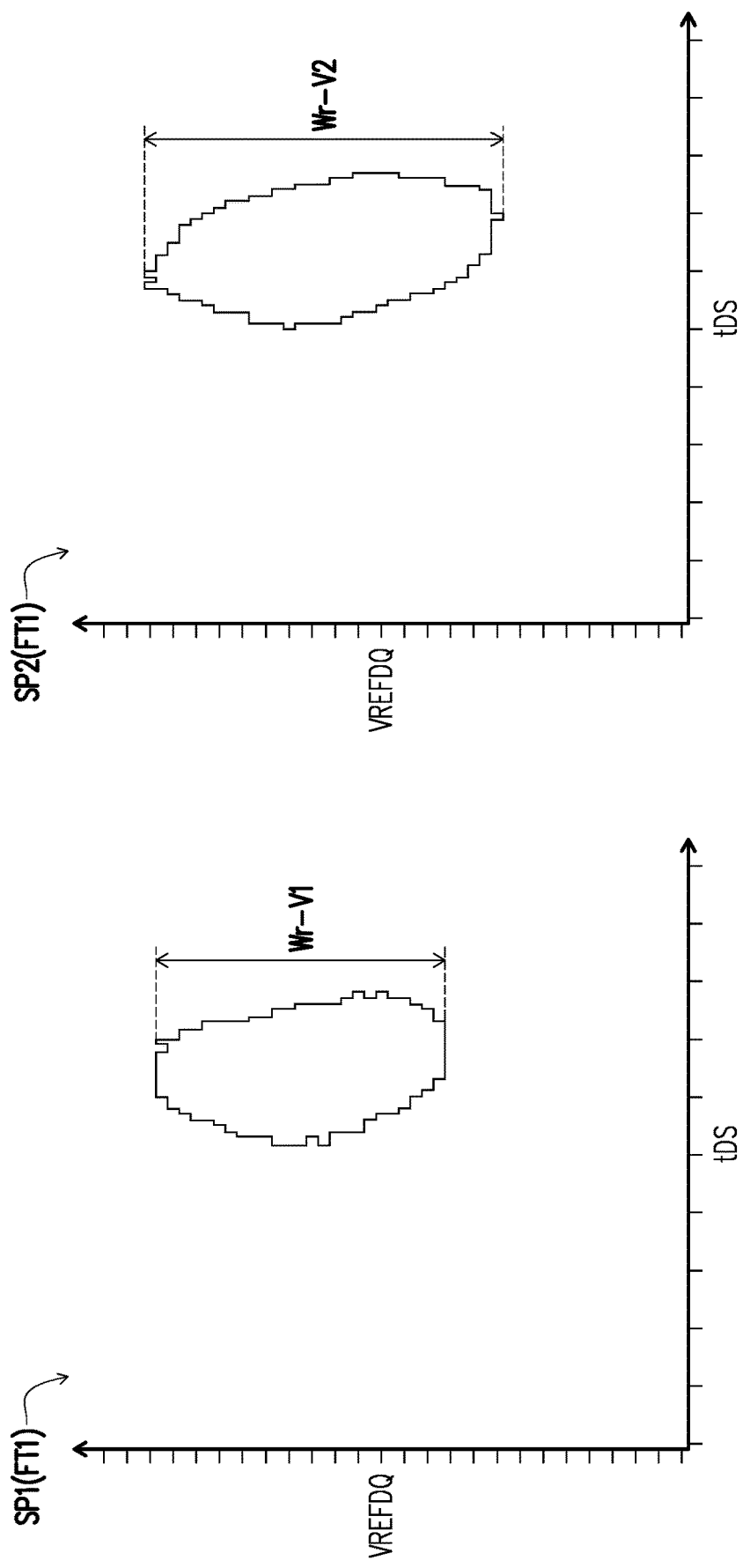
FIG. 8A illustrates shmoo plots of a high data transition frequency according to an embodiment of the disclosure.
Figure 8B:
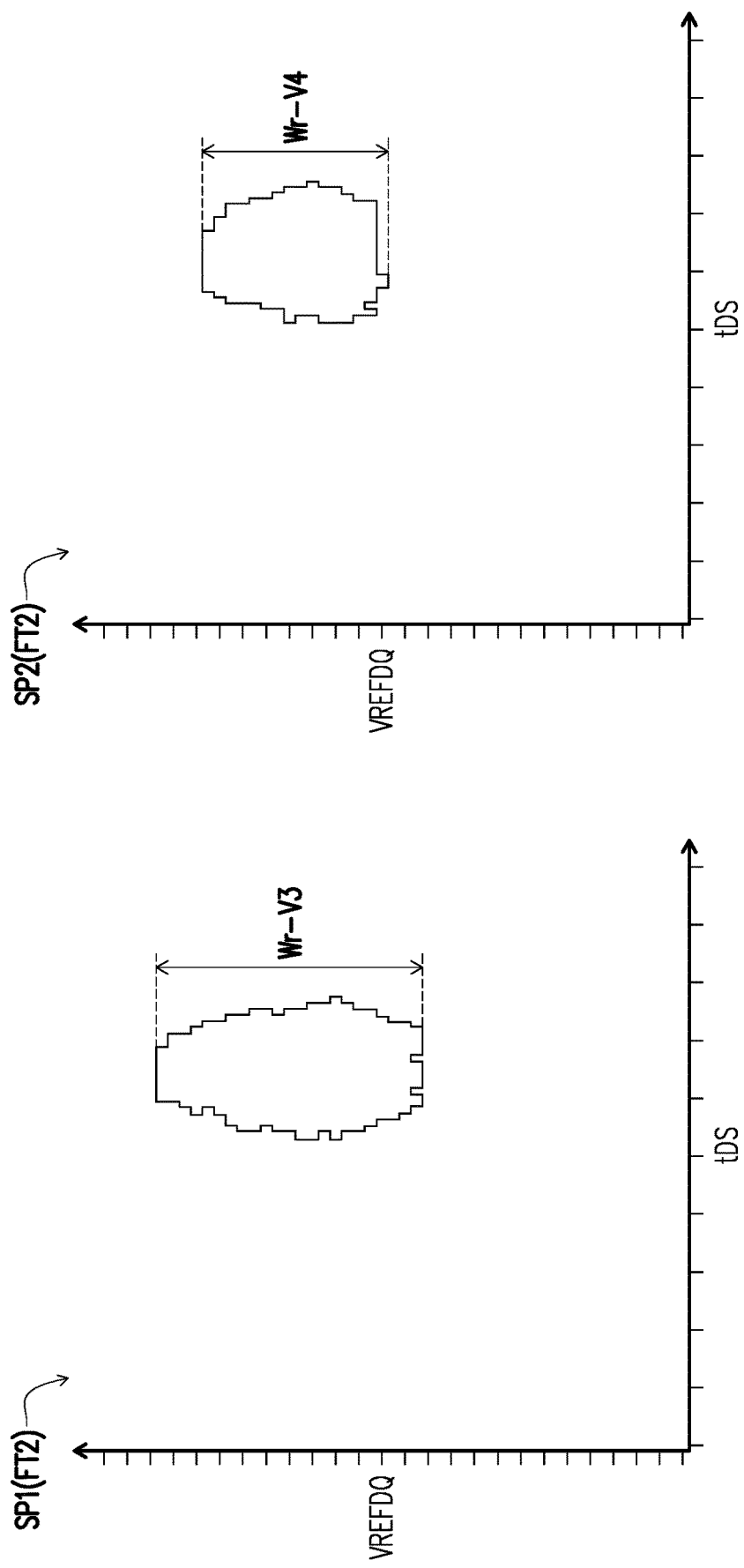
FIG. 8B illustrates shmoo plots of a low data transition frequency according to an embodiment of the disclosure.

FIG. 8A illustrates shmoo plots of a high data transition frequency according to an embodiment of the disclosure. FIG. 8B illustrates shmoo plots of a low data transition frequency according to an embodiment of the disclosure. Please refer to FIG. 5, FIG. 8A and FIG. 8B. FIG. 8A illustrates a shmoo plot SP1(FT1) of the data transition frequency FT1 corresponding to the first DFE D1 and a shmoo plot SP2(FT1) of the data transition frequency FT1 corresponding to the second DFE D2. FIG. 8B illustrates a shmoo plot SP1(FT2) of the data transition frequency FT2 corresponding to the first DFE D1 and a shmoo plot SP2 (FT2) of the data transition frequency FT2 corresponding to the second DFE D2. Vertical axes of the shmoo plots SP1(FT1), SP2(FT1), SP1(FT2) and SP2(FT2) are the reference voltage VREFDQ. Horizontal axes of the shmoo plots SP1(FT1), SP2(FT1), SP1(FT2) and SP2(FT2) are the data input setup time tDS.

For example, the compensating intensity of the first DFE D1 is lower than the compensating intensity of the second DFE D2. Thus, based on the data transition frequency FT1, the shmoo plot SP1(FT1) has a voltage margin window Wr-V1 of the reference voltage VREFDQ indicating that the reference voltage VREFDQ is suitable for the data transition frequency FT1. The shmoo plot SP2(FT1) has a voltage margin window Wr-V2 of the reference voltage VREFDQ indicating that the reference voltage VREFDQ is suitable for the data transition frequency FT1. The voltage margin window Wr-V2 is wider than the voltage margin window Wr-V1. Therefore, the second DFE D2 is suitable for the high data transition frequency (that is, the data transition frequency FT1).

based on the data transition frequency FT2, the shmoo plot SP1(FT2) has a voltage margin window Wr-V3 of the reference voltage VREFDQ indicating that the reference voltage VREFDQ is suitable for the data transition frequency FT2. The shmoo plot SP2(FT2) has a voltage margin window Wr-V4 of the reference voltage VREFDQ indicating that the reference voltage VREFDQ is suitable for the data transition frequency FT2. The voltage margin window Wr-V3 is wider than the voltage margin window Wr-V4. Therefore, the first DFE D1 is suitable for the low data transition frequency (that is, the data transition frequency FT2). In other words, a DFE having high compensating intensity is not suitable for the writing operation with the low data transition frequency.

In view of the foregoing, the memory controller writes the first test data pattern into the first memory section with a first DFE and writes the second test data pattern into a second memory section with the first DFE. The memory controller reads the first reading data pattern stored in the first memory section and the second reading data pattern stored in the second memory section. The memory controller generates the test result signal of the first DFE according to the first reading data pattern and the second reading data pattern. Therefore, the test result signal of the first DFE indicates whether the first DFE is suitable for the first data transition frequency or the second data transition frequency.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A test method for a testing decision feedback equalization (DFE) of a memory device, wherein the memory device comprises a memory bank and a memory controller, wherein the test method comprises:
   providing, by the memory controller, a first test data pattern having a first data transition frequency and a second test data pattern having a second data transition frequency different from the first data transition frequency;
   writing, by the memory controller, the first test data pattern into a first memory section of the memory bank with a first DFE in a first write interval;
   writing, by the memory controller, the second test data pattern into a second memory section of the memory bank with the first DFE in a second write interval;
   reading, by the memory controller, a first reading data pattern stored in the first memory section and a second reading data pattern stored in the second memory section in a first read interval after the first write interval and the second write interval; and
   generating, by the memory controller, a first test result signal of the first DFE according to the first reading data pattern and the second reading data pattern.

2. The test method of claim 1, wherein the step of generating the first test result signal according to the first reading data pattern and the second reading data pattern comprising:
   comparing the first test data pattern and the first reading data pattern; and
   when the first test data pattern is different from the first reading data pattern, generating a first test result signal indicating that the first test data pattern is different from the first reading data pattern.

3. The test method of claim 2, wherein the step of generating the first test result signal according to the first reading data pattern and the second reading data pattern comprising:
   comparing the second test data pattern and the second reading data pattern; and
   when the first second data pattern is different from the second reading data pattern, generating a test result signal indicating that the second test data pattern is different from the second reading data pattern.

4. The test method of claim 1, further comprises:
   setting a second DFE.

5. The test method of claim 4, further comprises:
   writing, by the memory controller, the first test data pattern into a third bank of the memory bank with the second DFE in a third write interval;
   writing, by the memory controller, the second test data pattern into a fourth bank of the memory bank with the second DFE in a fourth write interval;
   reading, by the memory controller, a third reading data pattern stored in the third bank and a fourth reading data pattern stored in the fourth bank in a second read interval after the third write interval and the fourth write interval; and
   generating, by the memory controller, a second test result signal of the second DFE according to the third reading data pattern and the fourth reading data pattern.

6. The test method of claim 1, further comprising:
   adjusting a reference voltage of the first DFE.

7. The test method of claim 6, further comprising:
   adjusting a data input setup time of the first DFE.

8. The test method of claim 7, further comprising:
   creating, by the memory controller, a shmoo plot of the first DFE according to a plurality of different reference voltage and a plurality of different data input setup time of the first DFE.

9. The test method of claim 8, wherein the first data transition frequency is higher than the second data transition frequency.

10. The test method of claim 8, wherein the first data transition frequency is equal to a frequency a clock of the memory device.

* * * * *